(12) United States Patent
Lee et al.

(10) Patent No.: US 12,506,027 B2
(45) Date of Patent: Dec. 23, 2025

(54) SUBSTRATE TREATMENT APPARATUS HAVING HEATING PART

(71) Applicant: DEVICE CO., LTD., Chungcheongnam-do (KR)

(72) Inventors: Taek Youb Lee, Cheonan-si (KR); Hee Won Lee, Cheonan-si (KR)

(73) Assignee: DEVICE CO., LTD., Chungcheongnam-do (KR)

( * ) Notice: Subject to any disclaimer, the term of this patent is extended or adjusted under 35 U.S.C. 154(b) by 126 days.

(21) Appl. No.: 18/424,117

(22) Filed: Jan. 26, 2024

(65) Prior Publication Data

US 2025/0096031 A1 Mar. 20, 2025

(30) Foreign Application Priority Data

Sep. 15, 2023 (KR) .......................... 10-2023-0123253

(51) Int. Cl.
| | | |
|---|---|---|
| *H01L 21/687* | (2006.01) | |
| *H01L 21/67* | (2006.01) | |
| *H05B 3/16* | (2006.01) | |
| *H01L 21/683* | (2006.01) | |

(52) U.S. Cl.
CPC .. *H01L 21/68728* (2013.01); *H01L 21/67109* (2013.01); *H05B 3/16* (2013.01); *H01L 21/67051* (2013.01); *H01L 21/67103* (2013.01); *H01L 21/683* (2013.01); *H01L 21/68785* (2013.01)

(58) Field of Classification Search
CPC ............. H01L 21/68785; H01L 21/683; H01L 21/67109; H01L 21/67103; H01L 21/67051; H01L 21/68728; H05B 3/16
See application file for complete search history.

(56) References Cited

U.S. PATENT DOCUMENTS

| | | | |
|---|---|---|---|
| 10,658,204 B2 * | 5/2020 | Hill ................... | H01L 21/67115 |
| 10,720,343 B2 * | 7/2020 | Mui ................... | H01L 21/67051 |
| 11,043,403 B2 * | 6/2021 | Kim ................... | H01L 21/68728 |
| 11,410,863 B2 | 8/2022 | Shimai et al. | |
| 2008/0051644 A1 * | 2/2008 | Tabibiazar ............. | A61B 5/415 |
| | | | 600/309 |

(Continued)

FOREIGN PATENT DOCUMENTS

| | | | | |
|---|---|---|---|---|
| KR | 1020130023116 A | | 3/2013 | |
| KR | 1020220150493 A | | 11/2022 | |
| KR | 20230029174 A | * | 3/2023 | ....... H01L 21/68792 |

Primary Examiner — Benjamin L Osterhout
(74) *Attorney, Agent, or Firm* — BLANK ROME LLP

(57) ABSTRACT

The present disclosure relates to a substrate treatment apparatus including: a chuck base having a ring-shaped spin chuck with chuck pins disposed on top thereof to support a substrate and a chuck support part located on the lower portion of the inner peripheral surface of the spin chuck; a back nozzle assembly mounted through a hollow portion formed at the center of the chuck base to spray treatment liquid onto a lower surface of the substrate; cover glass disposed between top of the spin chuck and the back nozzle assembly; and a heating part located inside the inner peripheral surface of the spin chuck in a space between the cover glass and the chuck support part, wherein the spin chuck is separably coupled to the chuck support part in an up-down direction.

7 Claims, 6 Drawing Sheets

(56) References Cited

U.S. PATENT DOCUMENTS

| | | | |
|---|---|---|---|
| 2014/0090669 A1* | 4/2014 | Hinode | H01L 21/30604 |
| | | | 134/105 |
| 2014/0231013 A1* | 8/2014 | Hinode | H01L 21/67051 |
| | | | 156/345.23 |
| 2014/0339215 A1* | 11/2014 | Plazonic | H01L 21/68792 |
| | | | 219/443.1 |
| 2015/0034133 A1* | 2/2015 | Kim | H01L 21/67051 |
| | | | 134/105 |
| 2016/0013079 A1* | 1/2016 | Choi | H01L 21/67051 |
| | | | 156/345.21 |
| 2017/0043379 A1* | 2/2017 | Sasaki | H01L 21/6708 |
| 2017/0256433 A1* | 9/2017 | Hammer | H01L 21/67051 |
| 2018/0002811 A1* | 1/2018 | Motomatsu | C23C 18/163 |
| 2018/0047596 A1* | 2/2018 | Si | H01L 21/67034 |
| 2019/0311923 A1* | 10/2019 | Kim | H01L 21/6708 |
| 2019/0318946 A1* | 10/2019 | Kim | H01L 21/67115 |
| 2020/0075355 A1* | 3/2020 | Kwon | H01L 21/67115 |
| 2023/0067737 A1 | 3/2023 | Lee | |

* cited by examiner

SUBSTRATE TREATMENT APPARATUS HAVING HEATING PART

CROSS REFERENCE TO RELATED APPLICATION OF THE DISCLOSURE

The present application claims the benefit of Korean Patent Application No. 10-2023-0123253 filed in the Korean Intellectual Property Office on Sep. 15, 2023, the entire contents of which are incorporated herein by reference.

FIELD OF THE DISCLOSURE

The present disclosure relates to a substrate treatment apparatus having a heating part, more specifically to a substrate treatment apparatus having a heating part that is capable of providing a coupling structure in which a maintenance work for a spin chuck of a chuck base is easily performed.

BACKGROUND OF THE RELATED ART

Generally, a substrate treatment apparatus is an apparatus that performs, with the use of treatment liquids, various processes such as deposition, photolithography, etching, and cleaning for substrates such as semiconductor wafers, substrates for display, optical disk substrates, magnetic disk substrates, photomask substrates, ceramic substrates, solar cell substrates, and the like.

Among them, the cleaning process is carried out to remove foreign substances or particles from the substrate, and representatively, a treatment liquid is supplied to an upper surface or a lower surface of a substrate to perform the cleaning process for the substrate, while the substrate is rotating at a high speed in a state of being supportedly placed on top of a chuck base (spin head).

In this case, a heating part is located under the substrate to allow the substrate to be heated to a given temperature, and next, if the heated substrate rotates so that it is subjected to a given treatment, a reaction occurs fast to reduce the amount of a treatment liquid used. Further, the environmental contamination caused by the application of the treatment liquid is minimized, and the time required for the treatment is shortened to achieve improvement of productivity and a reduction in the quantity of electricity consumed.

Various technologies and studies of a substrate treatment apparatus capable of rotating the substrate in a state where the substrate is heated have been proposed and developed.

Further, chuck pins are disposed on the chuck base to fix the substrate thereto, and if the lifespan of the chuck pins is completed or they are damaged, a maintenance work for replacing them with new ones is required. To replace the chuck pins, in this case, they have to be separated from a mechanism for moving them.

In the case where such a heating part is located in the existing substrate treatment apparatus, the heating part is placed above the chuck base, and if the chuck base is separated from the substrate treatment apparatus to perform the maintenance work thereof, even the heating part having wires complicatedly connected has to be separated from the substrate treatment apparatus, thereby undesirably making it hard and inconvenient to perform the maintenance work such as separation, replacement, and re-installation of the chuck pins.

SUMMARY OF THE DISCLOSURE

Accordingly, the present disclosure has been made in view of the above-mentioned problems occurring in the related art, and it is an object of the present disclosure to provide a substrate treatment apparatus having a heating part that is capable of allowing chuck pins to be replaced with new ones, without any separation of the heating part therefrom, thereby performing a maintenance work for a chuck base easily and conveniently.

To accomplish the above-mentioned objects, according to the present disclosure, there is provided a substrate treatment apparatus having a heating part, including: a chuck base having a ring-shaped spin chuck with chuck pins disposed on top thereof to support a substrate and a chuck support part located on the lower portion of the inner peripheral surface of the spin chuck; a back nozzle assembly mounted through a hollow portion formed at the center of the chuck base to spray treatment liquid onto a lower surface of the substrate; cover glass disposed between top of the spin chuck and the back nozzle assembly; and the heating part located inside the inner peripheral surface of the spin chuck in a space between the cover glass and the chuck support part, wherein the spin chuck is separably coupled to the chuck support part in an up-down direction.

According to the present disclosure, desirably, the chuck support part may have a plurality of locking groove supports spaced apart from one another along the outer peripheral surface thereof, and the spin chuck may have a plurality of locking protrusions protruding from the inner peripheral surface thereof in such a way as to be separably lockedly inserted into the locking groove supports in the up-down direction by means of fastening members.

According to the present disclosure, desirably, each locking groove support is formed by a groove concavely formed toward the inside from the outer peripheral surface of an upper portion of the chuck support part and a shelf part formed on a bottom of the groove in a thickness direction of the chuck support part, and the locking protrusions have complementary side peripheral surfaces to the locking groove supports.

According to the present disclosure, desirably, in a state where the locking protrusions and the locking groove supports may be coupled to one another, tops of the locking protrusions may be located on the same plane as tops of the chuck support part, and the fastening members may be prevented from protruding from top of the locking protrusions.

According to the present disclosure, desirably, the outer peripheral surface of the heating part may have the shape corresponding to the inner peripheral surface of the spin chuck, and the heating part may have a plurality of first grooves formed along the outer peripheral surface thereof to pass the locking protrusions therethrough.

According to the present disclosure, desirably, the substrate treatment apparatus may further include a heat sink may contact a lower surface of the heating part. Outer peripheral surface of the heat sink has a shape that matches the outer peripheral surface of the heating part, and the outer peripheral surface of the heat sink has a plurality of second grooves formed along the outer peripheral surface of the heat sink to pass the locking protrusions therethrough.

According to the present disclosure, desirably, the fastening members may be fixing bolts passing through the locking protrusions in up-down directions in such a way as to be fastened to the bottoms of the locking groove supports.

BRIEF DESCRIPTION OF THE DRAWINGS

The above and other objects, features and advantages of the present disclosure will be apparent from the following detailed description of the embodiments of the disclosure in conjunction with the accompanying drawings, in which.

DETAILED DESCRIPTION OF THE PREFERRED EMBODIMENT

Figure 1:
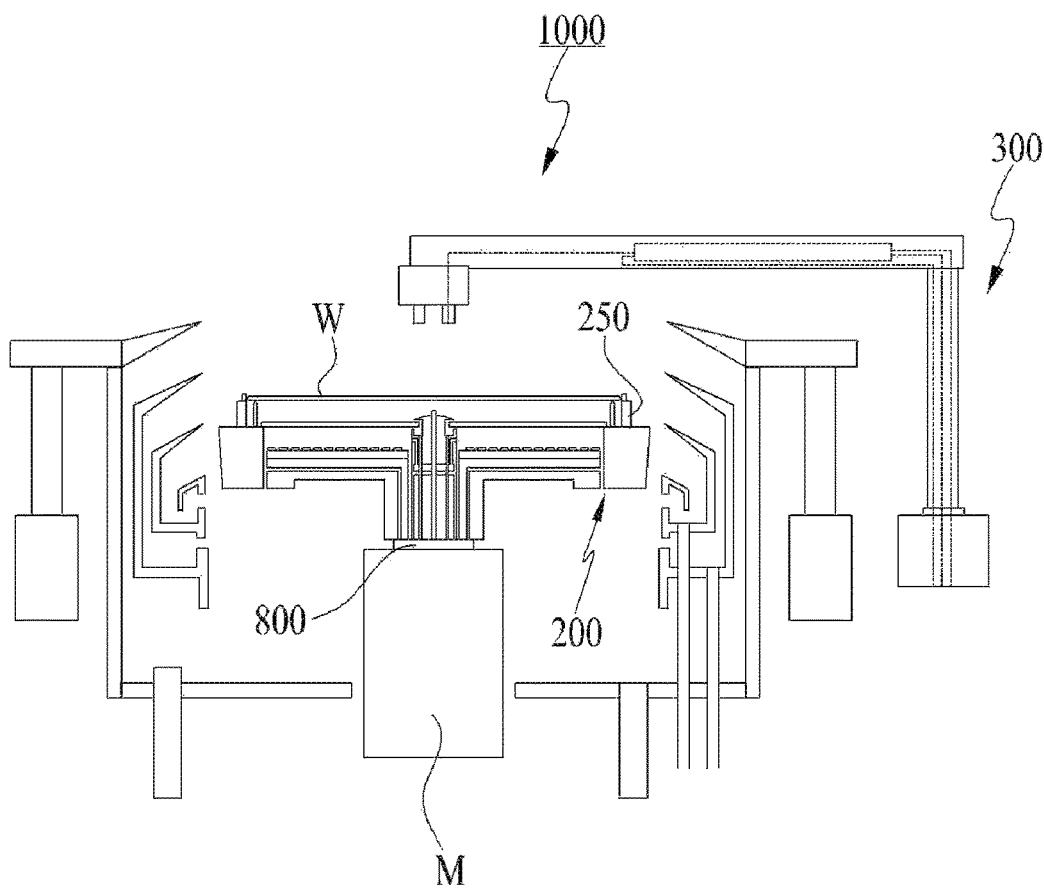
FIG. 1 is a front sectional view showing a substrate treatment apparatus according to the present disclosure.
Figure 2:
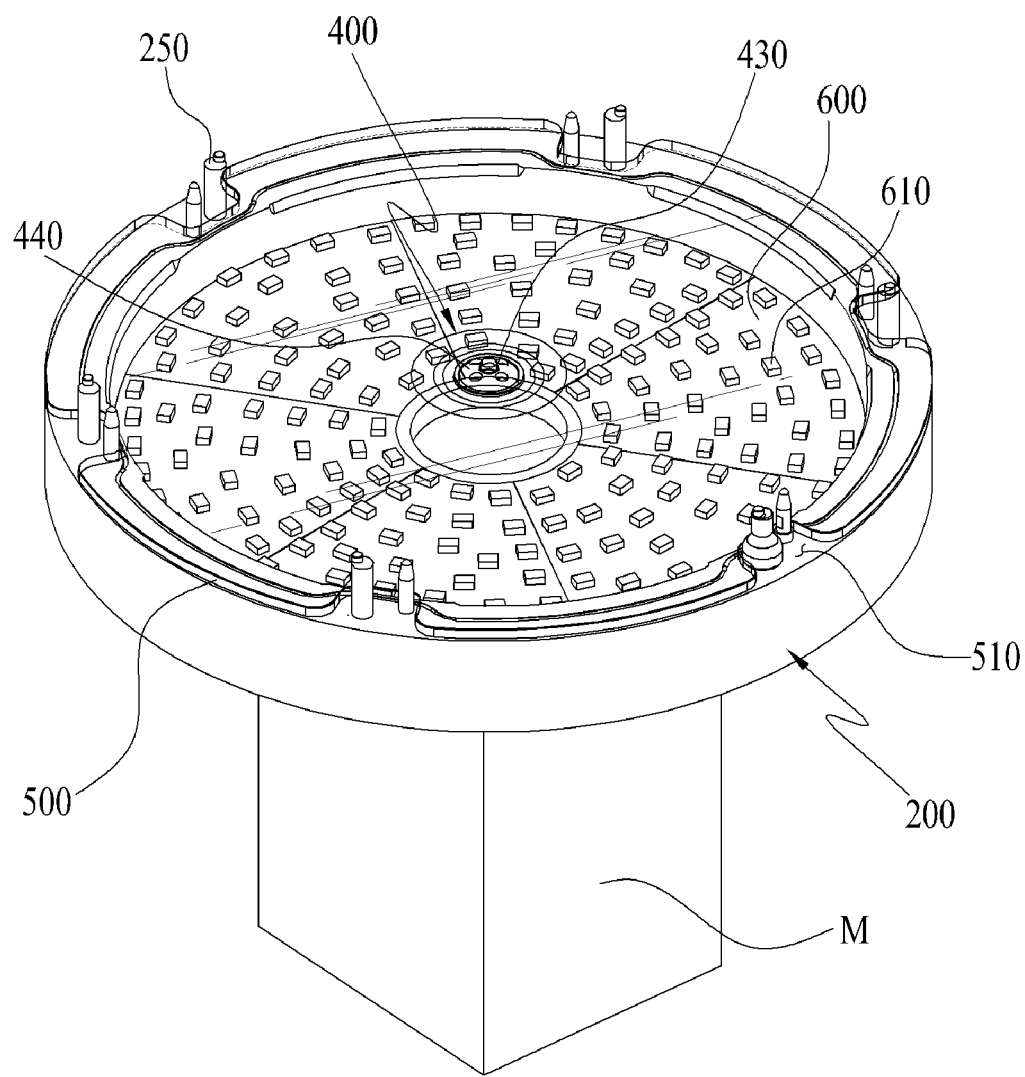
FIG. 2 is a perspective view showing main parts of the substrate treatment apparatus according to the present disclosure.

Hereinafter, an embodiment of the present disclosure will be explained in detail with reference to the attached drawings.

As shown in FIGS. 1 to 5, a substrate treatment apparatus 1000 according to the present disclosure includes: a chuck base 200 connected to a driving shaft 800 of a motor M in such a way as to be rotatable at a given speed and having a ring-shaped spin chuck 210 with chuck pins 250 disposed on top thereof to support a substrate W and a chuck support part 220 located on the lower portion of the inner peripheral surface of the spin chuck 210; a back nozzle assembly 400 mounted through a hollow portion 240 formed at the center of the chuck base 200 to spray treatment liquids onto a lower surface of the substrate W; cover glass 500 disposed between top of the spin chuck 210 and the back nozzle assembly 400; and a heating part 600 located inside the inner peripheral surface of the spin chuck 210 in a space between the cover glass 500 and the chuck support part 220, wherein the spin chuck 210 is separably coupled to the chuck support part 220 in an up-down direction.

Under such a configuration, various maintenance works for the spin chuck 210, such as the replacement of the chuck pins 250, and the like, are performed, without any separation of the heating part 600 from the substrate treatment apparatus 1000, thereby making it easy and convenient to perform the maintenance for the chuck base 200.

Figure 3:
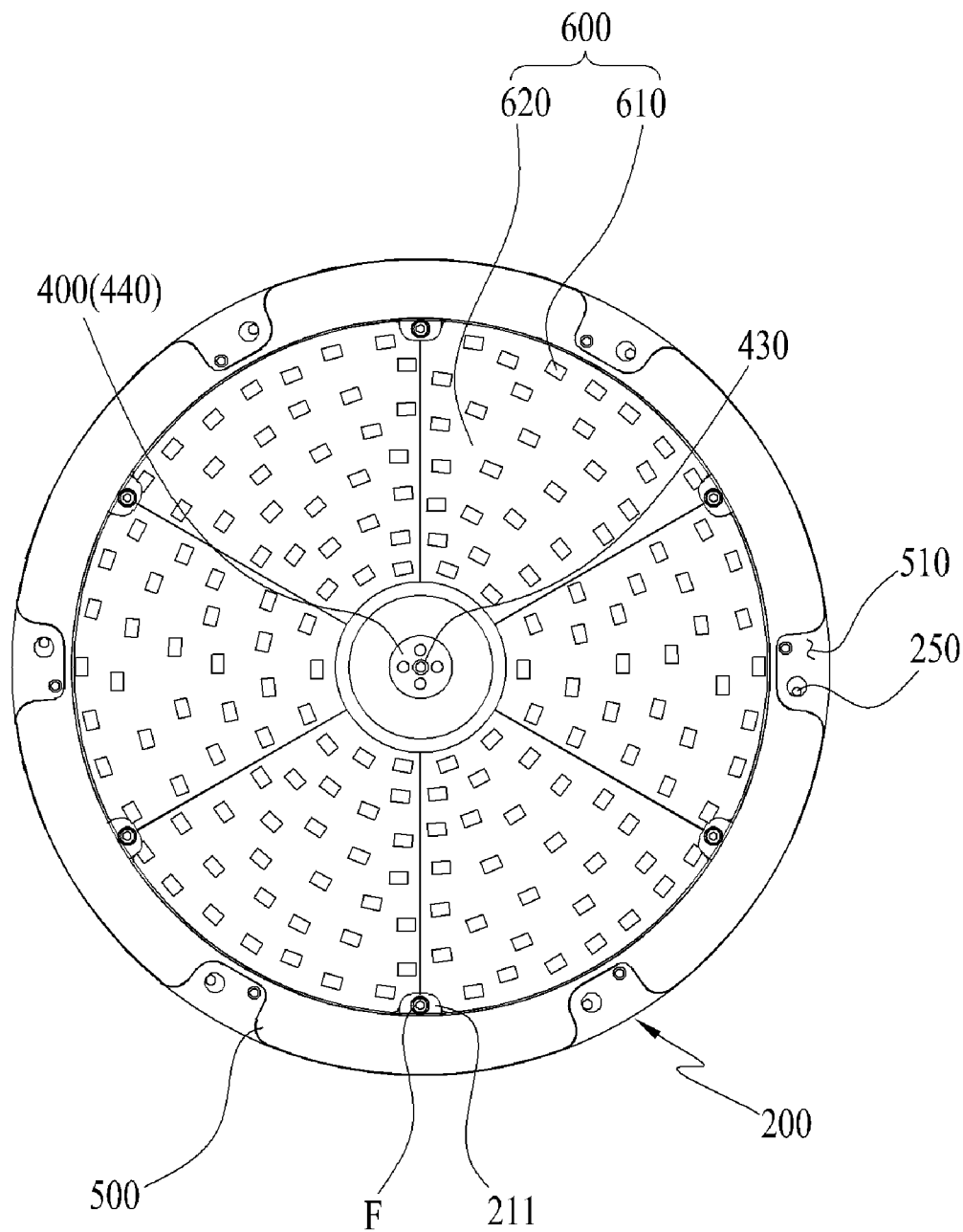
FIG. 3 is a plan view of FIG. 2.

When viewed in plan view, as shown in FIG. 3, the spin chuck 210 has the shape of the ring, and when the circular substrate W is installed on the spin chuck 210 and rotates, accordingly, the spin chuck 210 desirably has no weight unbalance with the substrate W in a circumferential direction thereof.

Figure 4:
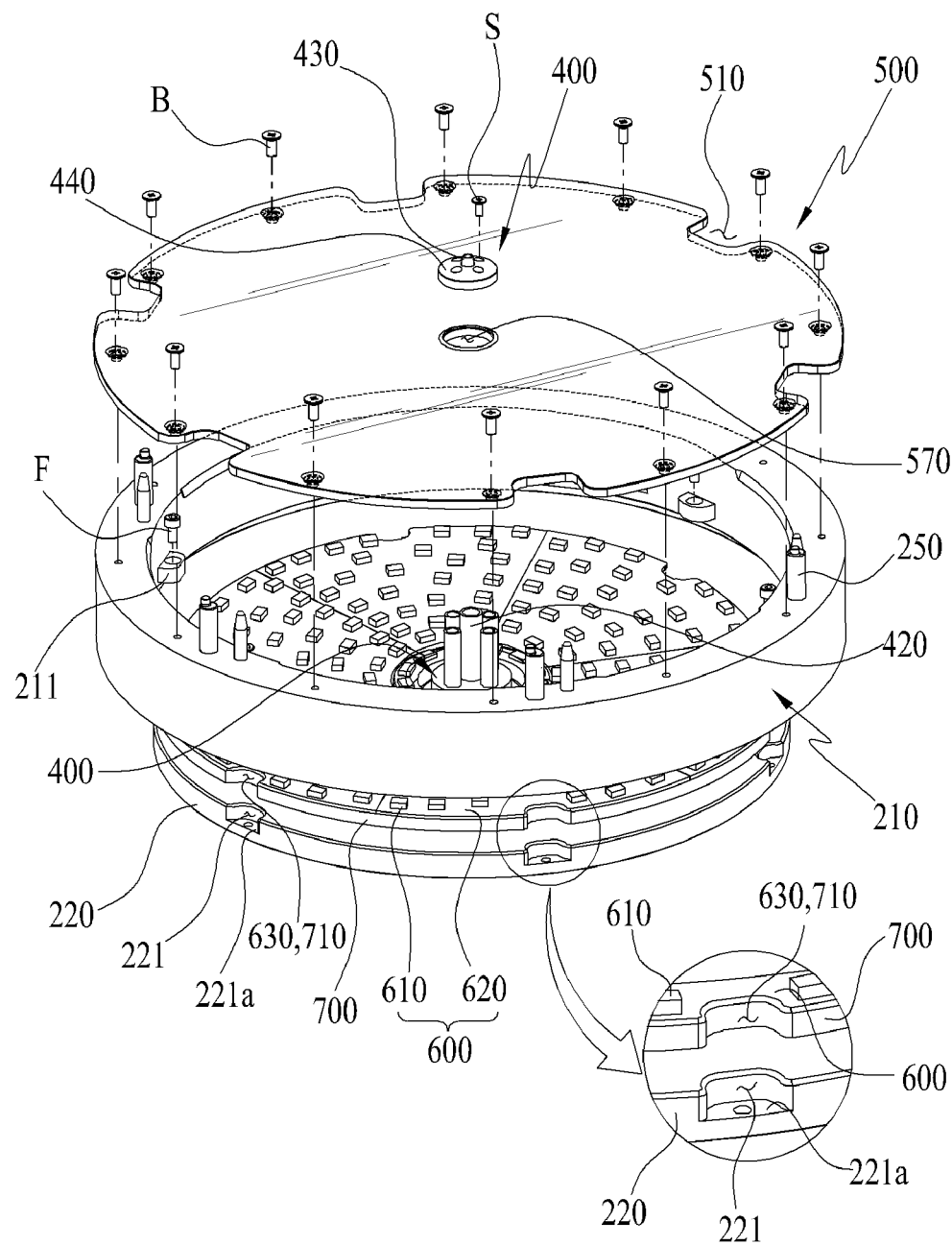
FIG. 4 is an exploded perspective view showing main parts of FIG. 2.
Figure 5:
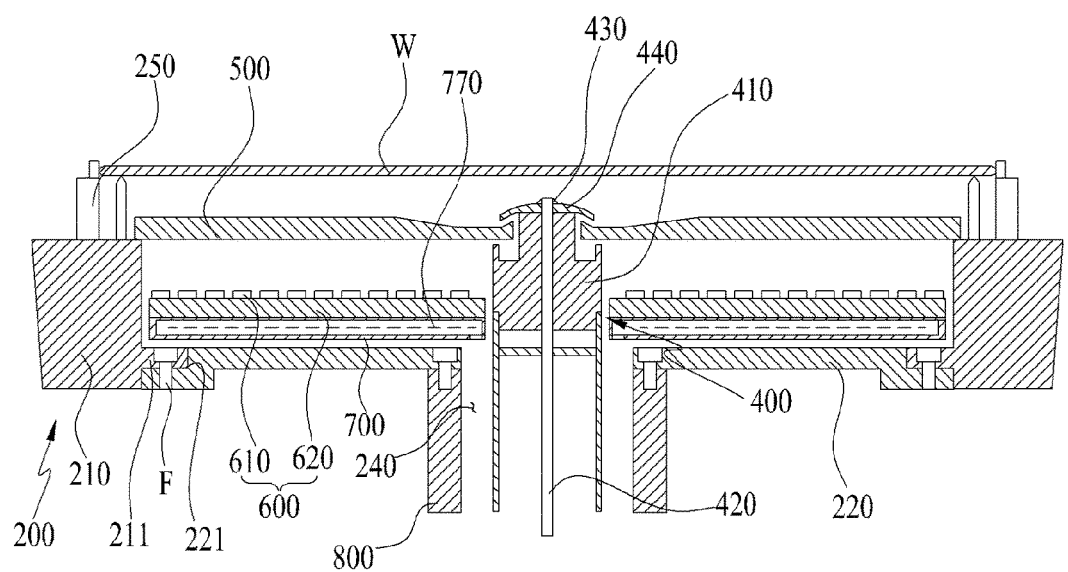
FIG. 5 is a front sectional view showing the main parts of FIG. 2.
Figure 6:
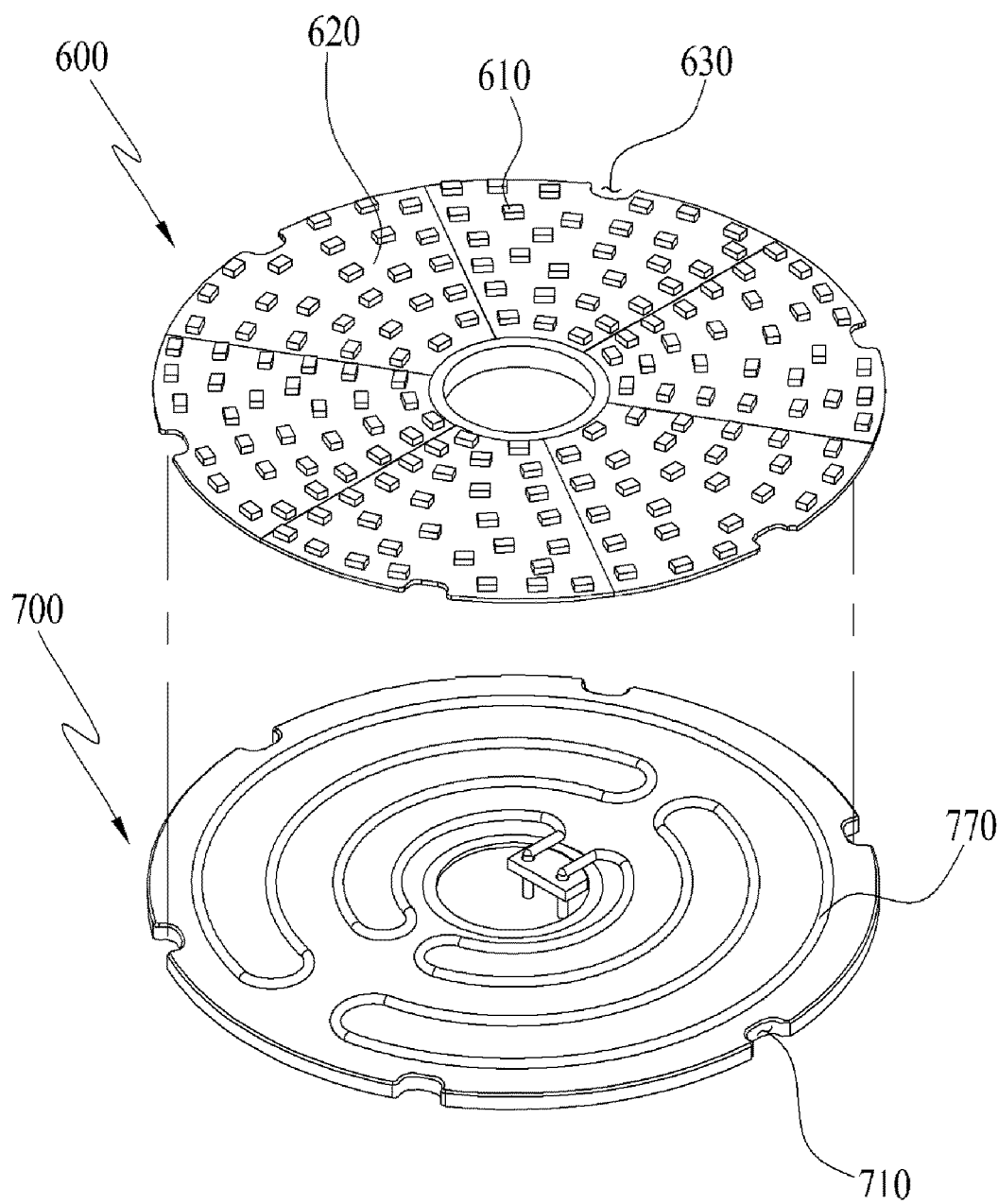
FIG. 6 is an exploded perspective view showing a heating part and a heat sink of FIG. 4.

As shown in FIGS. 4 to 6, the heating part 600 includes heaters 610 such as LEDs, IR lamps, and the like and a printed circuit board 620 on which the heaters 610 are mounted, and accordingly, various parameters such as turning on/off, intensity of light, and the like are controlled by the control functions of the printed circuit board 620.

Further, the heating part 600 is fixedly coupled to the back nozzle assembly 400, coupled relatively rotatable thereto, or movable up and down with respect to the back nozzle assembly 400.

In this case, the printed circuit board 620 of the heating part 600 is desirably located inside the spin chuck 210 and has the outer periphery facing the inner periphery of the spin chuck 210 so that the substrate W is uniformly heated.

That is, the outer peripheral surface of the heating part 600 has the shape corresponding to the inner peripheral surface of the spin chuck 210.

However, if the plurality of heaters 610 are located in pre-intended arrangements, the printed circuit board 620 may not be limited specially in shape, and accordingly, it just have to be located inside the spin chuck 210.

Further, a heat sink 700 contacts a lower surface of the heating part 600 to effectively emit the heat generated from the heating part 600.

The cover glass 500 serves to prevent the treatment liquid sprayed from the back nozzle assembly 400 from entering the heating part 600 and to allow the heat generated from the heating part 600 to be transferred therethrough.

The cover glass 500 desirably has the shape of a circle to avoid weight unbalance in the circumferential direction thereof, while having installation grooves 510 at which the chuck pins 250 are located.

To allow the spin chuck 210 and the chuck support part 220 to be separably coupled to each other in the up-down direction, the chuck support part 220 has a plurality of locking groove supports 221 spaced apart from one another along the outer peripheral surface thereof, and the spin chuck 210 has a plurality of locking protrusions 211 protruding from the inner peripheral surface thereof in such a way as to be lockedly inserted into the locking groove supports 221 in the up-down direction. In this case, the locking protrusions 211 and the locking groove supports 221 are separably coupled to one another by means of fastening members F.

Accordingly, the spin chuck 210 is prevented from swinging in a rotational direction or up-down direction with respect to the chuck support part 220.

Each locking groove support 221 is formed by a groove concavely formed toward the inside from the outer peripheral surface of an upper portion of the chuck support part 220 and a shelf part formed on a bottom of the groove in a thickness direction of the chuck support part 220.

The locking protrusion 211 and the locking groove support 221 have complementary side peripheral surfaces to each other, and only if they are coupled to each other, the locking protrusion 211 rotates integrally with the locking groove support 221 in a state of being seated onto the shelf part 221a, so that the spin chuck 210 is prevented from swinging in the rotational direction of the chuck base 200 with respect to the chuck support part 220.

In this case, when viewed in plan view, the locking protrusions 211 and the locking groove supports 221 become gradually narrow in width toward the center of the spin chuck 210, but they may not be limited specially in shape only if they have given areas to which the fastening members F are coupled.

Through the fastening members F, the locking protrusions 211 and the locking groove supports 221 are fixedly coupled to one another more strongly, and the fastening members F are fixing bolts passing through the locking protrusions 211 in up-down directions and fastened to the shelf parts 221a as the bottoms of the locking groove supports 221.

In a state where the locking protrusions 211 and the locking groove supports 221 are coupled to one another, that is, in a state where the locking protrusions 211 are seated onto the locking groove supports 221, tops of the locking protrusions 211 are located on the same plane as tops of the chuck support part 220, so that when the heat sink 700 is coupled to the lower surface of the heating part 600 to face top of the chuck support part 220, the heat sink 700 and the chuck support part 220 have no interference with each other, thereby allowing the substrate treatment apparatus 100 to be configured more compactly.

Further, the hole to which the fastening member F is coupled desirably has the shape of a counter sink to prevent the head of the fastening member F from protruding from top of the locking protrusion 211.

Further, the heating part 600 has a plurality of first grooves 630 formed along the outer peripheral surface thereof to pass the locking protrusions 211 therethrough, so that when the spin chuck 210 is coupledly descended toward the chuck support part 220, desirably, the locking protrusions 211 of the spin chuck 210 have no interference with the heating part 600.

Further, the outer peripheral surface of the heat sink 700 has the shape that matches the outer peripheral surface of the heating part 600, and the heat sink 700 has a plurality of second grooves 710 formed along the outer peripheral surface thereof to pass the locking protrusions 211 therethrough, so that when the spin chuck 210 is coupledly descended toward the chuck support part 220, desirably, the locking protrusions 211 of the spin chuck 210 have no interference with the heat sink 700.

The heat sink 700 is made of a material having excellent thermal conductivity such as aluminum so that it can emit the heat fast.

Further, the heat sink 700 has a cooling water path 770 located therein to flow cooling water therealong so that the heat of the heat sink 700 is emitted to relatively cold outside through the cooling water path 770.

The back nozzle assembly 400 includes a body 410, a treatment liquid supply path 420 located inside the body 410, a back nozzle 430 connected to the treatment liquid supply path 420, and a nozzle skirt 440, on which the back nozzle 430 is formed or to which the back nozzle 430 is coupled, and detachably coupled to top of the body 410.

As shown in FIG. 1, the substrate treatment apparatus 100 includes a fluid supply unit 300 for supplying treatment liquid to an upper surface of the substrate W.

Hereinafter, an explanation of a coupling process of the substrate treatment apparatus 1000 having the heating part 600 according to the present disclosure will be given with reference to FIGS. 4 to 6.

Firstly, the heat sink 700 and the heating part 600 are installed sequentially above the chuck support part 220 of the chuck base 200. The heating part 600 and the heat sink 700 are fixedly, rotatably, or movably up and own coupled to the body 410 of the back nozzle assembly 400 as a non-rotary part. Further, the first grooves 630 and the second grooves 710 are aligned with one another in up-down directions.

Secondly, the spin chuck 210 of the chuck base 200 is descended and coupled to the chuck support part 220. In this case, the locking protrusions 211 of the spin chuck 210 pass through the first grooves 630 and the second grooves 710 and are seated onto the locking groove supports 221 of the chuck support part 220.

Thirdly, the cover glass 500 is fixed to top of the spin chuck 210 through fastening means such as bolts B.

Lastly, the nozzle skirt 440 of the back nozzle assembly 400 is coupled to the body 410 by means of a screw S, and in this case, the surrounding area of a through hole 570 formed at the center of the cover glass 500 is covered with the outer peripheral surface of the nozzle skirt 440.

A process of separating the spin chuck 210 to perform the maintenance work such as replacement, repair, and the like is carried out in the reverse order of the above-mentioned coupling process.

As described above, the substrate treatment apparatus having the heating part according to the present disclosure is configured to have the chuck base constituted of the ring-shaped spin chuck with the chuck pins disposed on top thereof to support the substrate and the chuck support part located on the lower portion of the inner peripheral surface of the spin chuck, the back nozzle assembly mounted through the hollow portion formed at the center of the chuck base to spray the treatment liquid onto the lower surface of the substrate, the cover glass disposed between top of the spin chuck and the back nozzle assembly, and the heating part located inside the inner peripheral surface of the spin chuck in a space between the cover glass and the chuck support part, wherein the spin chuck is separably coupled to the chuck support part in an up-down direction, thereby making it possible to perform various maintenance works for the spin chuck, such as the replacement of the chuck pins, and the like, without any separation of the heating part from the substrate treatment apparatus, and performing the maintenance for the chuck base more easily and conveniently.

According to the present disclosure, further, the substrate treatment apparatus having the heating part is configured to allow the chuck support part to have the plurality of locking groove supports spaced apart from one another along the outer peripheral surface thereof and to allow the spin chuck to have the plurality of locking protrusions protruding from the inner peripheral surface thereof in such a way as to be separably lockedly inserted into the locking groove supports in the up-down direction by means of the fastening members, so that the spin chuck is prevented from swinging in a rotational direction or up-down direction with respect to the chuck support part.

According to the present disclosure, furthermore, the substrate treatment apparatus having the heating part is configured to allow each locking groove support to be concavely formed toward the inside from the outer peripheral surface of top thereof in such a way as to have the projection formed on the bottom extending in a thickness direction of the chuck support part and to allow the locking groove supports to have complementary side peripheral surfaces to the locking protrusions, so that only if the locking protrusion and the locking groove support are coupled to each other, the locking protrusion rotates integrally with the locking groove support in a state of being seated onto the projection, thereby preventing the spin chuck from swinging in the rotational direction of the chuck base with respect to the chuck support part.

According to the present disclosure, besides, the substrate treatment apparatus having the heating part is configured to allow tops of the locking protrusions to be located on the same plane as tops of the chuck support part in a state where the locking protrusions and the locking groove supports are coupled to one another and to allow the fastening members to be prevented from protruding from top of the locking protrusions, so that when the heat sink is coupled to the lower surface of the heating part to face top of the chuck support part, the heat sink and the chuck support part have no interference with each other, thereby allowing the substrate treatment apparatus to be configured more compactly.

According to the present disclosure, further, the substrate treatment apparatus having the heating part is configured to allow the outer peripheral surface of the heating part to have the shape corresponding to the inner peripheral surface of the spin chuck and to allow the heating part to have the plurality of first grooves formed along the outer peripheral surface thereof to pass the locking protrusions therethrough, so that when the spin chuck is coupledly descended toward the chuck support part, the locking protrusions of the spin chuck have no interference with the heating part, thereby achieving easy coupling.

According to the present disclosure, furthermore, the substrate treatment apparatus having the heating part is configured to allow the heat sink to contact the lower surface of the heating part, outer peripheral surface of the heat sink having a shape that matches the outer peripheral surface of the heating part, while having the plurality of second grooves formed along the outer peripheral surface of the heat sink to pass the locking protrusions therethrough, so that when the spin chuck is coupledly descended toward the chuck support part, the locking protrusions of the spin chuck have no interference with the heat sink.

The present disclosure may be modified in various ways and may have several exemplary embodiments. It is therefore intended that the scope of the disclosure be limited not by this detailed description, but rather by the claims appended hereto, and it should be understood that the disclosure covers all the modifications, equivalents, and replacements within the idea and technical scope of the disclosure.

What is claimed is:

1. A substrate treatment apparatus having a heating part, comprising:
    a chuck base having a ring-shaped spin chuck with chuck pins disposed on top thereof to support a substrate and a chuck support part located on a lower portion of an inner peripheral surface of the spin chuck;
    a back nozzle assembly mounted through a hollow portion formed at a center of the chuck base to spray treatment liquid onto a lower surface of the substrate;
    a cover glass disposed between a top of the spin chuck and the back nozzle assembly; and
    a heating part located inside the inner peripheral surface of the spin chuck in a space between the cover glass and the chuck support part,
    wherein the spin chuck is separably coupled to the chuck support part in an up-down direction.

2. The substrate treatment apparatus according to claim 1, wherein the chuck support part has a plurality of locking groove supports spaced apart from one another along an outer peripheral surface thereof, and the spin chuck has a plurality of locking protrusions protruding from the inner peripheral surface thereof in such a way as to be separably lockedly inserted into the locking groove supports in the up-down direction by means of fastening members.

3. The substrate treatment apparatus according to claim 2, wherein each locking groove support is formed by a groove concavely formed toward an inside of an outer peripheral surface of an upper portion of the chuck support part and a shelf part formed on a bottom of the groove in a thickness direction of the chuck support part, and the locking protrusions have complementary side peripheral surfaces to the locking groove supports.

4. The substrate treatment apparatus according to claim 3, wherein the fastening members are fixing bolts passing through the locking protrusions in up-down directions in such a way as to be fastened to the shelf part of the locking groove supports.

5. The substrate treatment apparatus according to claim 2, wherein tops of the locking protrusions are located on a same plane as tops of the chuck support part in a state where the locking protrusions and the locking groove supports are coupled to one another, and the fastening members are prevented from protruding from a top of the locking protrusions.

6. The substrate treatment apparatus according to claim 2, wherein an outer peripheral surface of the heating part has a shape corresponding to the inner peripheral surface of the spin chuck, and the heating part has a plurality of first grooves formed along the outer peripheral surface thereof to pass the locking protrusions therethrough.

7. The substrate treatment apparatus according to claim 6, further comprising a heat sink contacting a lower surface of the heating part, an outer peripheral surface of the heat sink having a shape that matches the outer peripheral surface of the heating part and having a plurality of second grooves formed along the outer peripheral surface of the heat sink to pass the locking protrusions therethrough.

* * * * *